United States Patent [19] Striker

[11] 3,925,809
[45] Dec. 9, 1975

[54] SEMI-CONDUCTOR RECTIFIER HEAT SINK

[75] Inventor: David L. Striker, Plymouth, Mich.

[73] Assignee: Ford Motor Company, Dearborn, Mich.

[22] Filed: Feb. 4, 1975

[21] Appl. No.: 546,965

Related U.S. Application Data

[63] Continuation of Ser. No. 379,136, July 13, 1973, abandoned.

[52] U.S. Cl. .................... 357/81; 357/75; 357/76; 357/82; 174/16 HS; 174/52 DE

[51] Int. Cl.² .................................... H01L 23/02

[58] Field of Search ................... 357/76, 81, 82, 75; 174/16, 52

[56] References Cited

UNITED STATES PATENTS

| | | | |
|---|---|---|---|
| 2,474,809 | 7/1949 | Abbott | 357/82 |
| 2,752,541 | 6/1956 | Losco | 357/81 |
| 3,176,382 | 4/1965 | Dickson et al. | 357/81 |
| 3,388,739 | 6/1968 | Olson et al. | 357/76 |
| 3,486,083 | 12/1969 | Takada | 357/76 |
| 3,513,362 | 5/1970 | Yamamoto | 357/81 |
| 3,602,793 | 8/1971 | Grozinger | 357/81 |
| 3,641,374 | 2/1972 | Sato | 357/81 |
| 3,697,814 | 10/1972 | Christman | 357/76 |
| 3,727,114 | 4/1973 | Oshima | 357/81 |

*Primary Examiner*—Andrew J. James
*Attorney, Agent, or Firm*—Robert A. Benziger; Keith L. Zerschling

[57] ABSTRACT

An improved heat sink or heat dissipating structure for a semi-conductor rectifier assembly is disclosed. The heat sink assembly is comprised of a first plate member in thermal and electrical contact with means comprising the cathodes of a plurality of semi-conductor diode devices at least equal in number to the number of phases in the alternator structure for which the rectifier assembly is intended and a second plate member in thermal and electrical contact with the anodes of a second plurality of semi-conductor diode devices at least equal in number to the number of phases in the intended alternator structure. Each plate member is provided with a plurality of thickened portions in proximity to, and in generally surrounding relationship with, each of the diode devices. The thickened portions may include a plurality of fin elements to increase the surface areas thereof and a plurality of passages may be provided between adjacent fin elements to facilitate air flow over the surfaces.

7 Claims, 6 Drawing Figures

SEMI-CONDUCTOR RECTIFIER HEAT SINK

This is a Continuation of application Ser. No. 379,136 filed July 13, 1973 and now abandoned

BACKGROUND OF THE INVENTION

1. Field of the Invention

The present invention is related to the field of rectifier assemblies, primarily for use with polyphase AC alternators, to derive a DC output and in particular to heat dissipating means for such assemblies. Such structures are used for example in the battery charging circuit of an automobile.

2. Description of the Prior Art

The prior art teaches that a polyphase AC alternator output may be rectified to a DC signal by connecting pairs of diodes in electrical series relationship with the common anode/cathode electrode of each pair connected to receive one phase of the polyphase output of the alternator. The other anode and the other cathode will comprise at least a portion of the DC terminals. Three such pairs of diodes each having their common anode/cathode connected to one phase of a three phase alternator output will be connected in parallel to provide full rectification for the alternator and will comprise the DC output at their common anodes and their common cathodes.

The prior art teaches that such rectifier assemblies may be conveniently made for association with an alternator for use in recharging the battery of an automotive vehicle. The diodes of such structures are typically semi-conductor diode devices which may be used in either discreet diode form or may be laminated into a composite structure. As is well known, semi-conductor diode devices will fail if their operating temperatures rise above a level which may be predetermined and which may be, for example, in the neighborhood of 175°C for silicon diodes. The amount of heat generated within any one diode of such a rectifier assembly will be a function of the amount of current being carried by that diode member. An additional factor will be the amount of heat dissipation provided for the diode. At present, the diodes may be individually mounted in heat exchange and electrical contact with a pair of iron plates in fabricating a generally planar composite structure which may then be bolted or otherwise suitably secured within the alternator. In order to aid the dissipation of heat from the diodes, the rectifier assembly is usually mounted in proximity to a finned pulley member which receives the rotative power for driving the alternator and concomitantly forces a flow of air over the rectifier assembly structure with the air stream flowing generally perpendicularly to the plane of the heat sink plates.

The trend in modern automobile technology is to require that the alternator produce larger amounts of current for charging the battery and for also energizing associated accessory equipment such as radios, blower motors, door lock and speed control mechanisms, heated windows, window lifts, power seat mechanisms, pumps and the like. This generally tends to increase the amount of heat generated within the diodes and puts a larger demand on the heat dissipating capability of the associated structure. Another trend in automobile technology is to require emissions control equipment and exhaust gas treatment devices in close proximity to the engine to reduce the pollution effects of the automobile exhaust gases. Such emission control equipment tends to increase the underhood temperature of the automobile. The trend is for increasing the amount of emission control equipment thereby further increasing the underhood temperature of the vehicle. The present diode rectifier structures are not capable of providing adequate diode heat dissipation protection in the expected temperature environment and it is therefore an object of the present invention to provide an improved heat sink structure for a semi-conductor diode rectifier used in conjunction with an alternator for an automotive vehicle battery charging system. More particularly, it is the primary object of the present invention to provide a rectifier assembly heat sink structure which is capable of rapidly and efficiently dissipating diode generated heat energy in an elevated temperature environment.

The presently utilized rectifier assemblies are readily susceptible of automated manufacture and assembly. This automated manufacture and assembly capability greatly reduces the cost of such components. In order to maintain the benefits of the reduced cost, it is a still further object of the present invention to provide an alternator rectifier assembly having a large heat dissipating capability which is readily susceptible of automated manufacture and assembly. It is also an object of the present invention to provide such an alternator rectifier assembly which does not require any manual or hand operations in order to facilitate manufacture and assembly.

It is known to manufacture a composite rectifier heat sink assembly, as for example, shown in U.S. letters Pat. No. 3,648,121 "Laminated Semiconductor Structure" by Suenaga et al. using pellets or chips of semiconductor material laminated with conductor and insulator material to a pair of heat sink/DC terminal plates. Such structures are smaller in package size, mechanically strong and relatively inexpensive when compared with discrete diode rectifier assemblies. It is therefore a further object of the present invention to provide an improved heat sink structure for semi-conductor rectifier assemblies which is usable with discrete diode forms and with diode chip pellet forms of the rectifier assemblies.

SUMMARY OF THE INVENTION

The present invention contemplates the provision of a pair of metallic plate members which have good electrical conductivity characteristics and good heat sink capabilities, such as for example cooper or aluminum, upon which may be mounted the diodes of a polyphase alternator rectifier assembly. These two plate members will then become the positive and negative DC electrical conductive terminals. According to the present invention, the plate members are provided with means forming a substantially thickened portion in proximity to and in generally surrounding relationship with each of the semi-conductor diode devices in the rectifier assembly. The thickened portions are further provided with a plurality of fin elements so as to greatly increase the surface area of the heat sink means in the immediate vicinity of the semi-conductor diode devices. In order to improve the heat dissipation capability of these fin members, the heat sink means is further preferably provided with a plurality of air flow ports with each of the air flow ports being positioned intermediate a pair of adjacent fin members. This structure provides that the heat generated by the diode devices will be readily and rapidly conducted away from the diode devices by the heat sink member and will be dissipated to an air stream which moves in close proximity to the diode members. In order to provide improved thermal protection, the diode members may preferably be situated in cavities or bores provided partway through the thickened portions of the heat sink means so that the diode is in maximum heat exchange relation with the heat sink means.

One half of an even plurality of diode devices is connected in heat exchange contact to one of the plate members through their anode electrodes while the other half of the even plurality of diode devices is connected in heat exchange contact to the other of the plate members through their cathode electrodes. Circuit means are provided for connecting a cathode of each of the first group of diode devices to an anode of one of the second group of diode devices and for interconnecting each of these common anode/cathode connections to one phase of the polyphase alternator output.

DETAILED DESCRIPTION OF THE PREFERRED EMBODIMENT

Figure 1:
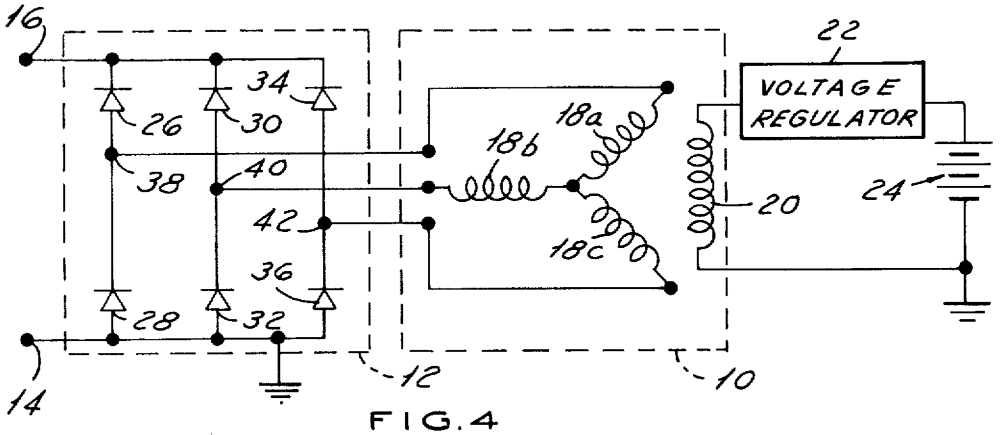
FIG. 1 illustrates an electrical schematic diagram of an alternator structure and a semi-conductor rectifier assembly with which the present invention is of utility.

Referring now to the drawing wherein like numbers designate like structure throughout the various views, FIG. 1 illustrates a representative electrical schematic for an alternator 10 as may be used in an automotive vehicle and of a rectifier assembly 12 used to convert the polyphase AC output of alternator 10 to a DC signal appearing at terminals 14, 16. Alternator 10 is typically comprised of a plurality of stationary stator coils 18*a*, 18*b*, and 18*c* sequentially excited by a variable magnetic field produced for example by rotating a DC energized field coil 20. In the illustration embodiment, field coil 20 receives a regulated voltage from voltage regulator 22 which in turn is in series with the positive terminal of battery 24. As illustrated, this system is usable by a vehicle having a negative ground and therefore the negative terminal of battery 24 is shown connected to ground.

Semi-conductor rectifier assembly 12 includes a plurality of pairs of series connected diodes 26 and 28, 30 and 32, and 34 and 36. Diodes 26, 30 and 34 have their cathodes connected to the output terminal 16 which will therefore be considered to be the positive terminal and diodes 28, 32 and 36 have their anodes connected to the ground terminal 14. The common anode/cathode 38 of diodes 26, 28 is connected to receive the alternating voltage signal produced across coil 18*a*. The common anode/cathode 40 of diodes 30, 32 is connected to receive the alternating voltage signal produced across coil 18*b*, while the common anode/cathode 42 of diodes 34, 36 is connected to receive the alternating voltage signal produced across coil 18*c*.

As illustrated in FIG. 1, alternator 10 is comprised of a stator field structure connected in a Y configuration. This configuration is merely exemplary and a delta configuration is also contemplated. The electrical polarity of output terminals 14, 16 and/or battery 24 could also be reversed and such reversal is also contemplated. The alternator 10 of FIG. 1 is illustrated as being of the three phase variety and greater, or lesser numbers of phases for such alternators are also within the scope of the present invention.

Figure 2:
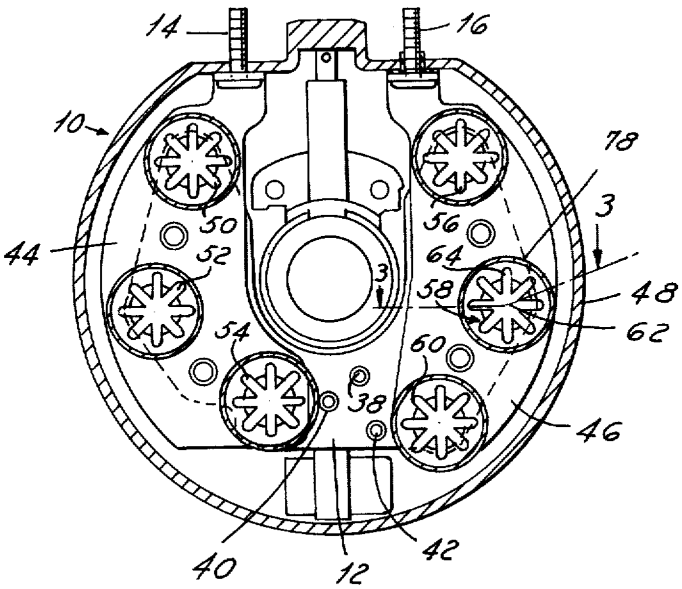
FIG. 2 shows an end view of a polyphase alternator structure, shown partly in section, incorporating a rectifier assembly and the heat sink means of the present invention.

Referring now to FIG. 2, the present invention is illustrated in association with an alternator 10 and a rectifier assembly 12. According to the present invention, a pair of heat sink plate members 44, 46 are connected to a pair of screw or lug terminal members which correspond to terminals 14, 16. Lug members 14, 16 are arranged to extend through housing member 48 of alternator 10 for communication to external electrical circuitry. In view of the fact that terminal 14 is to reside at the electrical ground or common potential, it merely extends through and is permitted to be in electrical contact with housing 48 while terminal lug member 16 is shown to be insulated electrically from housing 48. Plate member 44 includes a plurality of thickened portions 50, 52, 54 which are positioned with respect to rectifier assembly 12 and in particular with respect to three of the diodes thereof to be in proximity to and in surrounding relationship with respect to the three diode devices 26, 30, 34. Similarly, plate member 46 is shown to include three thickened portions 56, 58, 60 which are positioned with respect to the diode devices 28, 32, and 36 to be in proximity to and in surrounding relationship with respect to these diode devices. As is the common practice, diode devices 26, 30 and 34 are connected so that their cathodes are in electrical contact with the heat sink means represented by plate member 44 and thickened portions 50, 52 and 54. Similarly, diode devices 28, 32 and 36 are electrically connected through their anodes to the heat sink means represented by plate member 46 and thickened portions 56, 58, and 60.

Figure 3:
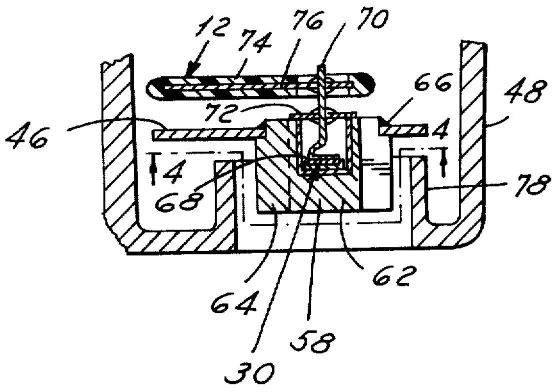
FIG. 3 is a sectional view taken along section line 3—3 of FIG. 2 illustrating one embodiment of the present invention.

Referring now to FIGS. 2 and 3, and in particular to FIG. 3, a portion of the heat sink structure is illustrated in a sectional view. Thickened portion 58 is comprised of a generally cylindrical central body portion 62 from which extend a plurality of generally radially directed arms 64. Central portion 62 is further provided with a cavity or bore which extends axially partway through the central portion 62 and diode member 30 is received within this bore. Thickened portion 58 is here illustrated as extending through a suitable hole within plate member 46 and is soldered or otherwise secured to plate member 46 as at 66 to be electrically and thermally continuous with the plate member. This places the thickened portions and plate members in thermal and electrical contact so as to provide, with respect to thermal activity, a unitary heat sink means comprised of the plate members 44 and 46 and the thickened portions 50, 52, 54, 56, 58 and 64. Each of the thickened portions 50, 52, 54, 56, 58 and 60 are similarly formed and similarly attached to their associated plate members 44, 46.

As further illustrated in FIG. 3, the diode member 30 is comprised of semi-conductor diode material indicated as 68 and is provided with external lead member 70 which is connected to rectifier assembly 12. Lead 70 corresponds to the anode electrode of the diode device 30. The cathode electrode of diode device 30 is comprised of canister portion 72 which generally surrounds the diode semi-conductor material 68 and is in electrical contact with a portion (the bottom portion relative to FIG. 3) thereof. Canister portion 72 is received within the bore of central portion 62 so as to be in intimate electrical and thermal contact, over a major portion of its surface area, with the central body portion 62 of the thickened portion.

Electrode 70 extends through the cover portion of canister 72 and is electrically insulated therefrom. As can also be seen in this Figure, the rectifier assembly portion 12 is generally comprised of an exterior insulator member 74 in surrounding relationship to an interior conductor member 76. Conductor member 76 is arranged to connect the anode of diode 30 with the cathode of the associated diode 32. With particular reference to FIG. 1, conductor 76 is electrically common with terminal or common anode/cathode 40. As is common practice, rectifier assembly 12 would be comprised of a plurality of mutually insulated conductor members similar to conductor member 76 with one conductor member for each pair of diode devices 26 and 28, 30 and 32, and 34 and 36.

It can be seen that housing 48 of alternator 10 also includes a generally annularly shaped cylindrical element 78 positioned to be in proximity to and in surrounding relationship with respect to thickened portion 58. Cylindrical element or duct 78 is operative to assist in directing an air flow stream in close proximity to the surfaces of fins 64. With reference to FIG. 2, each thickened portion of the heat sink means is similarly provided with means forming an air flow duct member 78.

Figure 4:
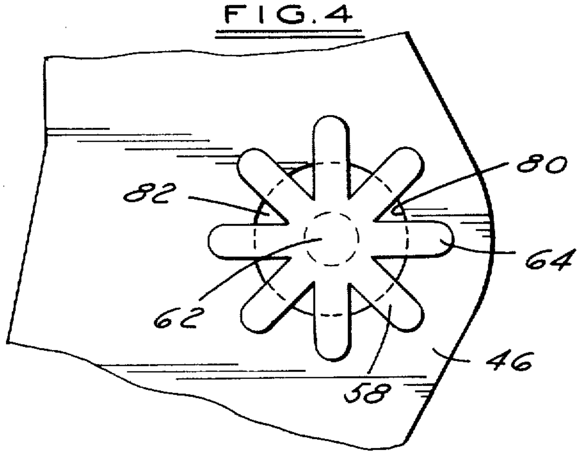
FIG. 4 is an enlarged view of a portion of FIG. 3, taken along section line 4—4 illustrating several features of the present invention.
Figure 5:
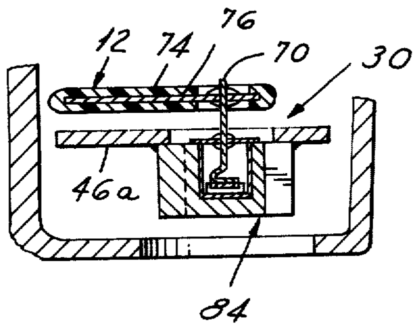
FIG. 5 is a view, similar to that of FIG. 3, illustrating one alternative embodiment of the present invention.

With reference now to FIGS. 2, 3 and 4 and in particular to FIG. 4, it can be seen that the thickened portions generally and the illustrated thickened portion 58 in particular, are arranged to be situated within a hole or passage 80 which is provided within the plate members and is arranged to be of a size such that the radius of the hole or passage 80 is slightly less than the radius of thickened portions at the tips of the fins 64 but greater than the radius of the thickened portions at the roots of the fins 64. This assures that a plurality of air flow passages such as at 82 will be provided between adjacent fin members to provide an air flow over each fin surface. As illustrated in these embodiments, thickened portions 50, 52, 54, 56, 58 and 60 may be provided by cutting off suitable lengths of extruded, solid copper or aluminum with the extruding die having the desired fin number and shape. As shown in the FIG. 3 embodiment, the tips of the fins at the end of the thickened portion in proximity to the cavity provided in the central portion 62 have been removed so that the thickened portion may be inserted within the passage 80. FIG. 5 illustrates an alternative embodiment wherein the material removal has not been required in view of the fact that thickened portion 84 has been suitably attached to one side of plate member 46*a* substantially centered with regard to the hole or passage 80. This FIG. 5 also shows an alternator housing 48*a* which does not include structure comparable to ducts 78 since some uses of the heat sink structure of this invention will not require the assistance to directing air flow provided by the ducts.

In manufacturing the heat sink means/rectifier assembly of the FIGS. 2, 3 and 4 embodiment, the thickened portions 50, 52, 54, 56, 58 and 60 are placed in locating pockets in a fixture. A solder preform is then positioned on each thickened portion and the heat sink plates 44, 46 are placed over the thickened portions. The diodes 26, 28, 30, 32, 34 and 36 are then coated on the bottom and sides with paste solder and positioned within the thickened portion cavities. The circuit structure 12 is then secured to the assembly with fixturing bolts and solder preforms are placed over the diode leads. The fixtures are then baked to complete the soldering operations and the electrically nonground (here the positive) half is electrical enamaled for insulation. By inserting the discrete diode element within a bore or cavity provided therefor in the thickened portion, maximum heat exchange between the diode canister 72 and the central portion 62 of the thickened portion can be obtained. It will be appreciated that discrete diodes are readily available with the canister as either anode or cathode electrode.

Figure 6:
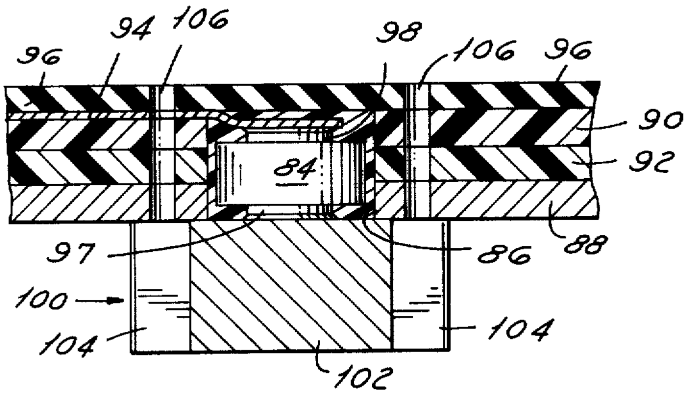
FIG. 6 is a view, similar to that of FIG. 3, illustrating a second alternative embodiment of the present invention.

The present invention is also of utility in connection with laminated semi-conductor rectifier assemblies which utilize semi-conductor pellets sandwiched between suitable insulating and conductive layers to form composite structures, as shown in FIG. 6. A pellet or chip of semi-conductor diode material 84 is located in a small cavity 86 formed in a heat sink plate member 88. One or more sheets or laminae of prepreg material, here sheets 90, 92, are arranged between plate member 88 and a sheet of laminae 94 of conductor material. For example, lamina 94 could readily comprise a series of coplanar sheets of copper conductor arranged as a circuit board to comprise the common anode/cathode terminals 38, 40, 42 of FIG. 1. A further sheet or lamina 96 is arranged to seal conductor lamina 94 for purposes of electrically insulating conductor lamina 94. One electrode 97 of the diode chip 84 would be arranged to contact the heat sink means while the other electrode 98 would be soldered or otherwise connected to conductor lamina 94. According to the present invention, thickened portion 100 is attached to plate member 88 in heat exchange contact in proximity to cavity 86. As shown in this FIG. 6, thickened portion 100 is comprised of a solid central body portion 102 and a plurality of fin elements 104 extending therefrom. In order to facilitate air flow over the heat exchange surfaces provided by fin elements 104, a plurality of passages 106 may be provided to extend through the rectifier assembly 12 in proximity to the fin elements. These passages may be provided in punching or drilling as a final assembly step but are preferably formed in the individual lamina which are positioned during fabrication to form the complete passages 106. Removable guide pins on an assembly fixture may accomplish this result.

In each of the embodiments illustrated, the thickened portion has been illustrated and described as a separately formed element soldered or otherwise bonded in heat exchange contact with a plate member. This form of thickened portion may be conveniently made of aluminum by impact extrusion from a pre-dimensioned slug. Alternatively, the thickened portion could be manufactured by machining, stamping, casting, forging, powdered metal processing or by a combination of these methods which could also include formation of the plate members and thickened portions as unitary forms.

In order to evaluate the heat sink capabilities of the instant invention, tests were conducted with a 90 ampere alternator and the rectifier assembly and heat sink means substantially as illustrated in FIG. 2. The plate members 44, 46 were comprised of aluminum plates having a thickness of 0.090 inches and the thickened portions (having fourteen fin elements) extended the thickness dimension at the diode locations to 0.490 inches. Ambient temperatures of 200°F were maintained and the maximum temperature measured at any one diode locations was 307°F. For purposes of comparison, similar tests were conducted using as a heat sink structure a pair of aluminum plates having a thickness of 0.125 inches. This structure corresponds in form to the prior art heat sink structures for discrete diode rectifier assemblies but for purposes of the comparison, the heat sink material was aluminum instead of the normally used iron. The maximum temperature measured at any diode location using otherwise identical test conditions was a temperature of 327°F. Thus the FIG. 2 embodiment of the present invention was capable of reducing maximum temperatures by an amount of 20°F. This represents approximately a 7 percent reduction in maximum temperatures which is of cardinal importance when it is considered that diode components, whether discrete or pellet, are readily available in commercial quantities and at low prices having maximum junction temperatures of 302°F. Operation for prolonged periods of time at temperatures above the maximum junction temperature will cause diffusion to occur at the pn junction causing diode reverse leakage to increase. The peak diode temperatures measured during testing are, of course, somewhat below the junction temperature due to predictable temperature gradients within the materials. However, peak measured temperatures could readily be reduced well below the maximum junction temperature by increasing the number of fins on the thickened portions or by increasing the thickness of the thickened portions, or both. For example, the number of fins could readily be increased to sixteen or eighteen or the thickness could be increased to 0.750 inches or thereabout. Thus, through the present invention, the present commercially available diodes may be made maximum temperature protected for use in rectifier assemblies. Regardless of temperature capabilities of the diode, it is considered best to operate rectifier assemblies with the lowest possible temperature rise over ambient. The basic reason for this is the reduction in cost of required platings, insulating materials, and solders for the lower temperature deviations and the greater ease of matching coefficients of expansion for the variety of materials used in the heat sink and diode rectifier assemblies. It should be pointed out that the diode heat sink structure of the above example, manufactured according to the present invention, utilized a lower total metal content than did the comparison heat sink structure. Thus, the present invention is capable of realizing improved heat sink capabilities while requiring less total metal content than would be required for similar heat sinking capability in a heat sink fabricated according to the teachings of the prior art.

It can thus be seen that the present invention readily accomplishes its stated objectives. The present structure provides for greatly increased mass of heat exchange material in thermal contact with the diode elements of a semi-conductor rectifier and further provides that greatly increased surface areas are made available for heat exchange with the ambient medium, for example the atmosphere. In addition, the structure as above disclosed and described provides for air flow passage holes which extend through the heat sink member to avoid the presence of any dead air pockets which would tend to retain heat and prevent sufficient heat exchange or to cause dissimilar heat exchange prompted by dissimilar air flow rates over various portions of the heat sink material.

I claim:

1. In a semi-conductor rectifier assembly for a polyphase AC alternator of the type having a plurality of semi-conductor diode members equal in number to twice the number of electrical phases in the alternator output, each of the diode members having a cathode electrode and an anode electrode, electrical circuit means interconnecting selected pairs of the diode members with the phases of the alternator output such that the cathode electrodes of the first diode member of a diode pair and the anode electrode of the second diode member of a diode pair are electrically common and are connected to receive a phase of the alternator output, and further electrical circuit means interconnecting the anode electrodes of the first diode members of the diode pairs and interconnecting the cathode electrodes of the second diode members of the diode pairs for producing a rectified DC output wherein the further electrical circuit means comprise first and second heat dissipating plate members having a generally uniform thickness in a first direction, the first plate member being electrically common with the anode electrodes of the first diode members of the diode pairs and the second plate member being electrically common with the cathode electrodes of the second diode members of the diode pairs, the improvement comprising:

a plurality of finned elements having fin members in thermal contact with the plate members and extending away therefrom in the first direction with said fin members extending away from the finned elements in a direction transverse to the first direction;

each of said diode members being arranged to be in thermal contact with one of the finned elements; and a plurality of apertures defining air flow passages extending through the first and second plate members in proximity to said fin members to facilitate air flow over said fin members.

2. In a polyphase AC alternator, a semi-conductor rectifier assembly comprising, in combination:

an even plurality of diode members, each diode member having an anode electrode and a cathode electrode, arranged in diode pairs wherein the anode electrode of one diode member of the pair is electrically connected to the cathode electrode of the other diode member of the pair;

first electrical circuit means for interconnecting the anode/cathode electrical junctions of each diode pair with one electrical pair of the alternator output on a one-to-one basis;

second electrical circuit means for interconnecting each of the remaining cathode electrodes and each of the remaining anode electrodes in series with an external load whereby a DC circuit may be established;

said second electrical circuit means including a pair of electrically conductive heat sinking plate members, one of said pair of plate members being electrically common with the remaining cathode electrodes and the other of said pair of plate members being electrically common with the remaining diode electrodes;

each of said plate members having a plurality of bores extending therethrough; and a finned element having a plurality of fin members received within said bore with fin members in contact with the sides of the bore whereby air may flow from one side of each plate member to the other side of said plate member over said fin;

said diode members being arranged in thermal contact with the finned element.

3. The rectifier assembly of claim 2 wherein said finned elements include a concavity and the diodes are located within said concavities in thermal contact with said finned elements.

4. The rectifier assembly of claim 3 wherein said finned elements are sized with respect to their associated plate member bores to permit air flow over said finned members and through at least a portion of said bores.

5. In a semi-conductor rectifier assembly for a polyphase AC alternator of the type having a plurality of semiconductor diode elements equal in number to twice the number of electrical phases of the alternator output, each diode element having anode and cathode electrodes, the diode elements being arranged in pairs with the diode elements of each pair connected electrically in series, first conductor means connecting the common anode/cathode junction of each diode pair to one phase of the alternator output, second conductor means interconnecting the remaining cathode electrodes to comprise one DC output and third conductor means interconnecting the remaining anode electrodes to comprise the second DC output wherein said second and third conductor means include first and second electrically conductive heat sinking plate members, respectively, the plate members having a generally uniform thickness in a first direction and being arranged to be in thermal and electrical communication with the remaining cathode electrodes and the remaining anode electrodes, respectively, the improvement comprising:

a plurality of bores extending through said first and second plate members in the first direction;

a plurality of finned elements attached to, and extending in the first direction away from, the plate members;

each of said finned elements having a plurality of fin members extending from the finned element in a direction transverse to the first direction with the outer portions thereof in contactive engagement with the associated plate member;

each of said finned elements being attached to one of said first and second plate members in proximity to at least one of said plurality of bores and arranged to permit air flowing through said one bore to flow adjacent to at least a portion of said fin members.

6. The rectifier assembly according to claim 5 wherein a plurality of air flow passages are arranged in surrounding relation to each of the finned elements in proximity to the fin members thereof.

7. The rectifier assembly according to claim 5 wherein the diode elements are received within the first and second plate member bores and are attached to the finned elements associated with the respective bores.

* * * * *